(12) United States Patent
Huang et al.

(10) Patent No.: US 9,462,718 B2
(45) Date of Patent: Oct. 4, 2016

(54) CIRCUIT BOARD MOUNTING APPARATUS

(71) Applicant: ShenZhen Treasure City Technology Co., LTD., ShenZhen (CN)

(72) Inventors: Chien-Chung Huang, New Taipei (TW); Zheng-Heng Sun, New Taipei (TW)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 914 days.

(21) Appl. No.: 13/727,539

(22) Filed: Dec. 26, 2012

(65) Prior Publication Data

US 2014/0157589 A1 Jun. 12, 2014

(30) Foreign Application Priority Data

Dec. 6, 2012 (CN) .......................... 2012 1 0517853

(51) Int. Cl.
*H05K 7/00* (2006.01)
*H05K 5/00* (2006.01)
*H05K 7/14* (2006.01)

(52) U.S. Cl.
CPC ............ *H05K 7/1417* (2013.01); *H05K 7/142* (2013.01); *Y10T 29/5313* (2015.01)

(58) Field of Classification Search
CPC .............................. H05K 7/142; G06F 1/184
USPC ........................................ 361/679.01–679.03
See application file for complete search history.

(56) References Cited

U.S. PATENT DOCUMENTS

| 6,741,460 B2* | 5/2004 | Huang | H05K 7/142 248/121 |
| 6,751,102 B1* | 6/2004 | Chen | H05K 7/142 174/138 D |

* cited by examiner

*Primary Examiner* — Jerry Wu
(74) *Attorney, Agent, or Firm* — Zhigang Ma

(57) ABSTRACT

A circuit board mounting apparatus includes a circuit board, a first mounting member, a second mounting member, and a third mounting member. The first and second mounting members are mounted to a front side of the circuit board. The third mounting member is mounted to a rear side of the circuit board. The circuit board is capable of being mounted to a first side plate of a first chassis in a perpendicular manner by the first and second mounting members, or is capable of being mounted to a second side plate of a second chassis in a parallel manner by the first, second, and third mounting members.

15 Claims, 6 Drawing Sheets

CIRCUIT BOARD MOUNTING APPARATUS

BACKGROUND

1. Technical Field

The present disclosure relates to a circuit board mounting apparatus.

2. Description of Related Art

In electronic devices, circuit boards may be mounted inside the devices with a number of screws extended through the circuit board and engaged in a number of posts on a bottom plate of the chassis of the devices. However, fastening screws manually in the chassis can be difficult and inconvenient because of limited space for maneuvering.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
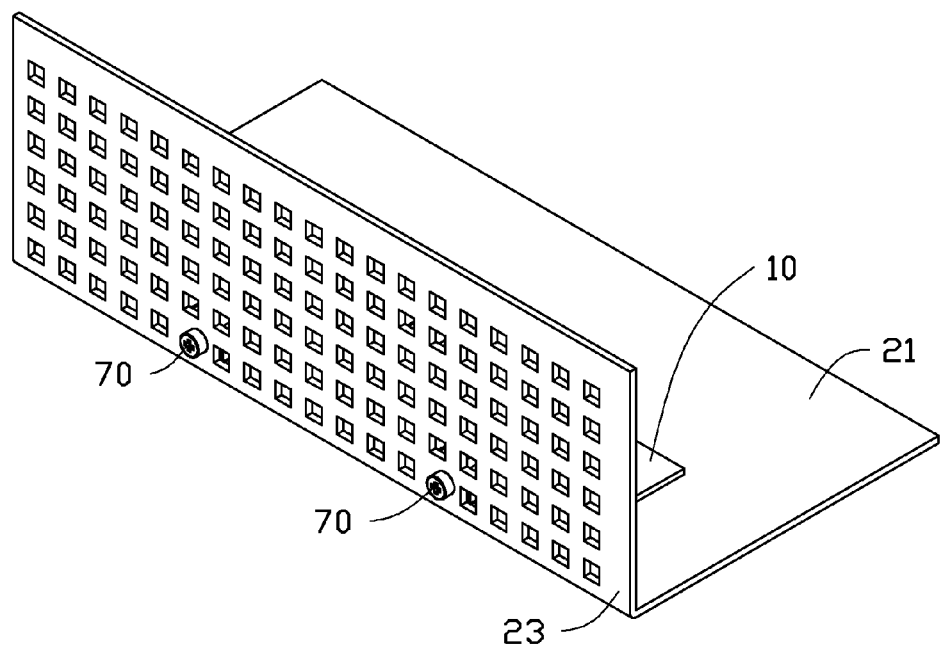
FIG. 1 is an assembled, isometric view of an exemplary embodiment of a circuit board mounting apparatus together with a first chassis.

The disclosure, including the accompanying drawings, is illustrated by way of example and not by way of limitation. It should be noted that references to "an" or "one" embodiment in this disclosure are not necessarily to the same embodiment, and such references mean "at least one".

FIGS. 1 to 4 and 6 show an exemplary embodiment of a circuit board mounting apparatus for mounting a circuit board 10 to either a first chassis 20 or a second chassis 30. The circuit board mounting apparatus includes the circuit board 10, a first mounting member 40, a second mounting member 50, a third mounting member 60, and two fasteners 70. In the embodiment, the fasteners 70 are screws.

Two first latching slots 12 are defined in opposite ends of a front side 11 of the circuit board 10, and a second latching slot 14 is defined in a middle of a rear side 13 of the circuit board 10. The circuit board 10 forms two first sidewalls 121 bounding opposite sides of each first latching slot 12. A first notch 123 is defined in each first sidewall 121 adjacent to a front end of the first sidewall 121. The circuit board 10 forms two second sidewalls 141 bounding opposite sides of the second latching slot 14. A second notch 143 is defined in each second sidewall 141 adjacent to a rear end of the second sidewall 141.

The first chassis 20 includes a first bottom plate 21 and a first side plate 23 extending up from the front side of the first bottom plate 21 in a substantially perpendicular manner. Two first through holes 231 are defined in the first side plate 23, adjacent to the first bottom plate 21.

The second chassis 30 includes a second bottom plate 31 and a second side plate 33 extending up from the front side of the second bottom plate 31 in a substantially perpendicular manner. A first slide hole 35 and a second through hole 36 are defined in the second side plate 33, adjacent to the second bottom plate 31. A second slide hole 37 is defined in the second side plate 33, above and between the first slide hole 35 and the second through hole 36. The first slide hole 35, the second slide hole 37, and the second through hole 36 are arranged in triangle form. Each of the first and second slide holes 35 and 37 includes a first hole 38 away from the second through hole 36, and a second hole 39 adjacent to the second through hole 36 and communicating with the first hole 38. A diameter of each first hole 38 is greater than a diameter of each second hole 39.

A horizontally extending first fixing hole 41 is defined in the front end of the first mounting member 40. Two first recesses 43 are respectively defined in opposite sides of the first mounting member 40, extending horizontally through the front end and the rear end of the first mounting member 40. A second recess 45 is defined in the rear end of the first mounting member 40, with opposite ends of the second recess 45 communicating with the corresponding first recesses 43. A resilient arm 431 slantingly extends forward and outward from a sidewall of each first recess 43. A hook 432 protrudes from an outer side of each resilient arm 431 adjacent to the front end of the resilient arm 431. A first latching portion 47 protrudes from a middle of the top of the first mounting member 40. The first latching portion 47 includes a columnar neck 471 connected to the first mounting member 40, and a head 473 formed on the top of the neck 471. A diameter of the head 473 is greater than a diameter of the neck 471.

A horizontally extending second fixing hole 51 is defined in the front end of the second mounting member 50. Two first recesses 53 are respectively defined in opposite sides of the second mounting member 50, extending horizontally through the front end and the rear end of the second mounting member 50. A second recess 55 is defined in the rear end of the second mounting member 50, with opposite ends of the second recess 55 communicating with the corresponding first recesses 53. A resilient arm 531 slantingly extends forward and outward from a sidewall of each first recess 53. A hook 532 protrudes from an outer side of each resilient arm 531 adjacent to the front end of the resilient arm 531. A latching hole 57 is defined in a middle of the top of the second mounting member 50. In the embodiment, the first and second fixing holes 41 and 51, and the latching hole 57 are threaded holes.

Two first recesses 63 are respectively defined in opposite sides of the third mounting member 60, extending horizontally through the front end and the rear end of the third mounting member 60. A second recess 65 is defined in the front end of the third mounting member 60, with opposite ends of the second recess 65 communicating with the corresponding first recesses 63. A resilient arm 631 slantingly extends rearward and outward from a sidewall of each first recess 63. A hook 632 protrudes from an outer side of each resilient arm 631 adjacent to the rear end of the resilient arm 631. A second latching portion 67 protrudes from a middle of the top of the third mounting member 60. The second latching portion 67 includes a columnar neck 671 connected to the third mounting member 60, and a head 673 formed on the top of the neck 671. A diameter of the head 673 is greater than a diameter of the neck 671.

Figure 4:
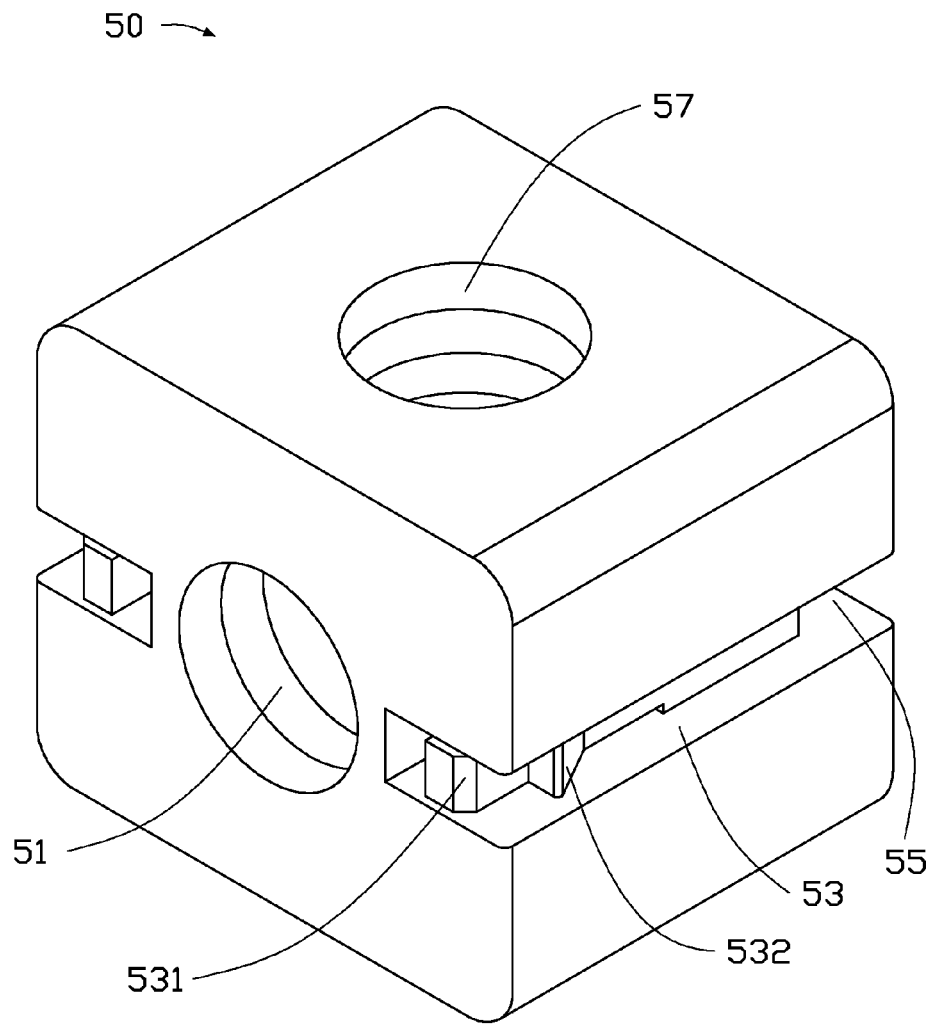
FIG. 4 is an enlarged view of the second mounting member of FIG. 3.

FIG. 4 shows the first slide recesses 53, the resilient arms 531, and the hooks 532 of the second mounting member 50. The structures of the first slide recesses 43 and 63, the resilient arms 431 and 631, and the hooks 432 and 632 of the first and third mounting members 40 and 60 are the same as the second mounting member 50.

In assembly, the first and second mounting members 40 and 50 are placed in front of the front side 11 of the circuit board 10, respectively aligning with the first latching slots 12. The first and second mounting members 40 and 50 are moved backward, to allow the first sidewalls 121 bounding the first latching slots 12 to engage in the first recesses 43 and 53, and to allow portions of the circuit board 10 bounding the rear ends of the first latching slots 12 to engage in the second recesses 45 and 55. The hooks 432 and 532 engage in the corresponding first notches 123 under the resilient forces of the resilient arms 431 and 531. Thereby, the first and second mounting members 40 and 50 are fixed to the front side 11 of the circuit board 10. The first and second fixing holes 41 and 51 are parallel to the circuit board 10.

The third mounting member 60 is placed behind the rear side 13 of the circuit board 10, and aligns with the second latching slot 14. The third mounting member 60 is moved forward, to allow the second sidewalls 141 bounding the second latching slot 14 to engage in the first recesses 63, and to allow a portion of the circuit board 10 bounding the front end of the second latching slot 14 to engage in the second recess 65. The hooks 632 engage in the corresponding second notches 143 under the resilient forces of the resilient arms 631. Thereby, the third mounting member 60 is fixed to the rear side 13 of the circuit board 10.

Figure 2:
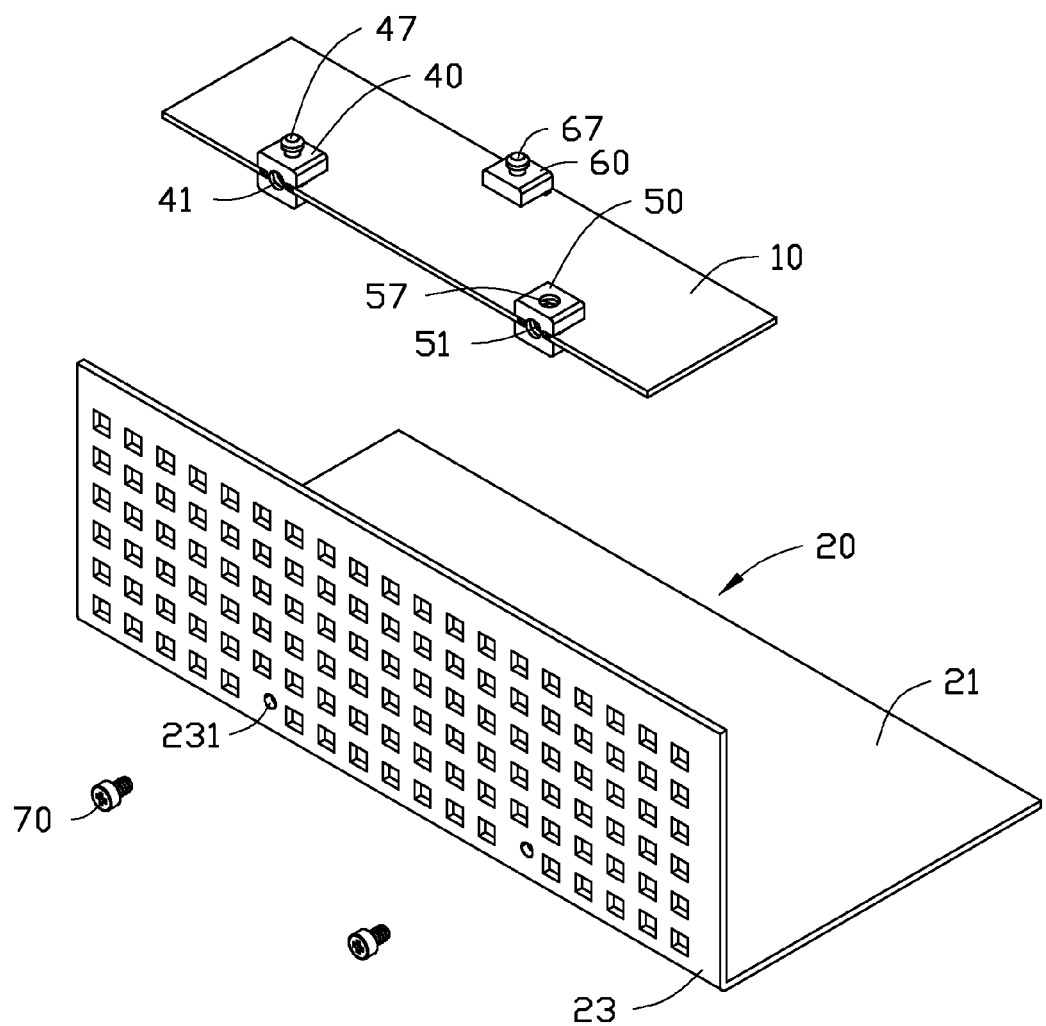
FIG. 2 is an exploded, isometric view of FIG. 1.
Figure 3:
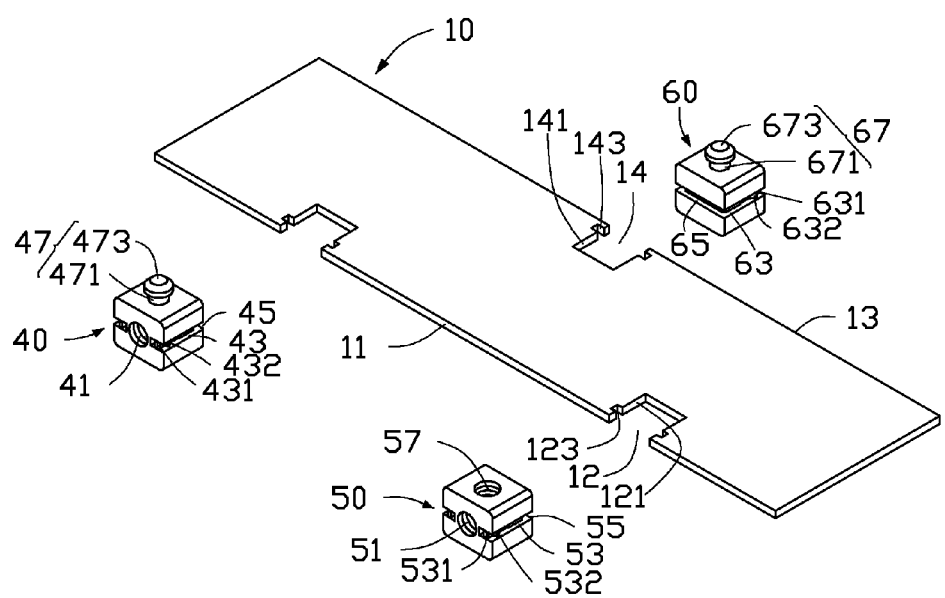
FIG. 3 is an exploded, isometric view of the circuit board mounting apparatus of FIG. 2, wherein the circuit board mounting apparatus includes a second mounting member.

FIGS. 1 and 2 show that to mount the circuit board 10 to the first chassis 20. The circuit board 10 is placed in the first chassis 20 parallel to the first bottom plate 21, to allow the first and second fixing holes 41 and 51 to respectively align with the first through holes 231. The two fasteners 70 respectively extend through the first through holes 231 and engage in the first and second fixing holes 41 and 51. Thereby, the circuit board 10 is perpendicularly mounted to the first side plate 23.

Figure 5:
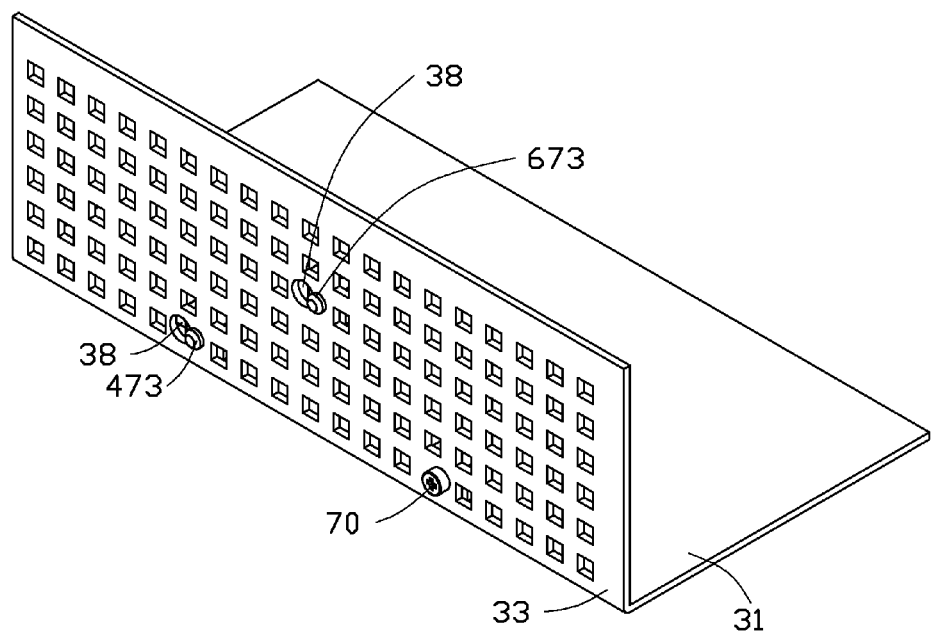
FIG. 5 is an assembled, isometric view of the circuit board mounting apparatus of FIG. 2 and a second chassis.
Figure 6:
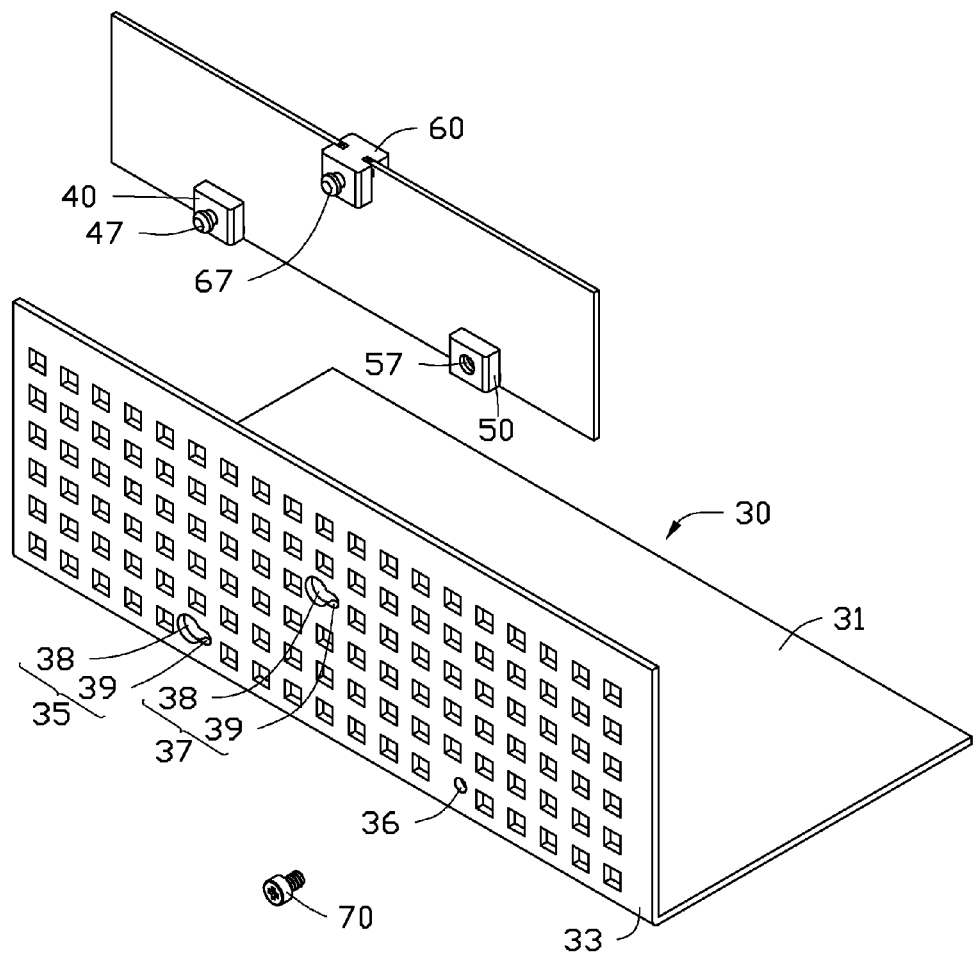
FIG. 6 is an exploded, isometric view of FIG. 5.

FIGS. 5 and 6 show that to mount the circuit board 10 to the second chassis 30, the circuit board 10 is placed in the second chassis 30 perpendicular to the second bottom plate 31. The heads 473 and 673 respectively extend through the first holes 38, to allow the necks 471 and 671 to be received in the first holes 38. The tops of the first, second, and third mounting members 40, 50, and 60 abut the rear side (also the inner side) of the second side plate 33. The circuit board 10 is slid along the second side plate 33, to allow the necks 471 and 671 to engage in the corresponding second holes 39. The heads 473 and 673 abut the front side (also the outer side) of the second side plate 33. The latching hole 57 aligns with the second through hole 36. One of the fasteners 70 extends through the second through hole 36 and engages in the latching hole 57. Thereby, the circuit board 10 is mounted to the second side plate 33 in parallel.

The circuit board mounting apparatus can mount the circuit board 10 to two kinds of chassis, and there are only one or two fasteners 70 that are installed from outside of the chassis, to be installed when mounting the circuit board 10, which is convenient.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A circuit board mounting apparatus, comprising:
   a circuit board;
   a first mounting member mounted to a front side of the circuit board, wherein a first fixing hole is defined in a front end of the first mounting member, and a first latching portion protrudes from a top of the first mounting member;
   a second mounting member mounted to the front side of the circuit board, wherein a second fixing hole is defined in a front end of the second mounting member, and a latching hole is defined in a top of the second mounting member; and
   a third mounting member mounted to a rear side of the circuit board, wherein a second latching portion protrudes from a top of the third mounting member;
   wherein the circuit board is capable of being mounted to either a first side plate of a first chassis in a perpendicular manner or a second side plate of a second chassis in a parallel manner; when the circuit board is perpendicularly mounted to the first side plate, two fasteners respectively extend through two spaced through holes defined in the first side plate and engage in the first and second fixing holes of the first and second mounting members; and when the circuit board is mounted to the second side plate in the parallel manner, the first and second latching portions of the first and third mounting members respectively extend through two slide holes defined in the second side plate and slide to engage with portions of the second side plate bounding the slide holes, a fastener extends through a second through hole defined in the second side plate and engages in the latching hole of the second mounting member.

2. The circuit board mounting apparatus of claim 1, wherein each fastener is a screw, and each of the latching hole and the first and second fixing holes is a threaded hole.

3. The circuit board mounting apparatus of claim 1, wherein a latching slot is defined in the front side of the circuit board, the circuit board forms two first sidewalls bounding opposite sides of the latching slot, a notch is defined in each first sidewall, two recesses are respectively defined in opposite sides of the first mounting member, extending horizontally through a front end and a rear end of the first mounting member, a resilient arm slantingly extends forward and outward from a second sidewall of each recess, a hook protrudes from an outer side of each resilient arm, the first sidewalls are respectively engaged in the recesses of the first mounting member, and the hooks are respectively engaged in the notches under resilient forces of the resilient arms.

4. The circuit board mounting apparatus of claim 1, wherein a latching slot is defined in the front side of the circuit board, the circuit board forms two first sidewalls bounding opposite sides of the latching slot, a notch is defined in each first sidewall, two recesses are respectively defined in opposite sides of the second mounting member, extending horizontally through a front end and a rear end of the second mounting member, a resilient arm slantingly extends forward and outward from a second sidewall of each recess, a hook protrudes from an outer side of each resilient arm, the first sidewalls are respectively engaged in the recesses of the second mounting member, and the hooks are respectively engaged in the notches under resilient forces of the resilient arms.

5. The circuit board mounting apparatus of claim 1, wherein a latching slot is defined in the rear side of the circuit board, the circuit board forms two first sidewalls bounding opposite sides of the latching slot, a notch is defined in each first sidewall, two recesses are respectively defined in opposite sides of the third mounting member, extending horizontally through a front end and a rear end of the third mounting member, a resilient arm slantingly extends rearward and outward from a second sidewall of each recess, a hook protrudes from an outer side of each resilient arm, the first sidewalls are respectively engaged in the recesses of the third mounting member, and the hooks are respectively engaged in the notches under resilient forces of the resilient arms.

6. The circuit board mounting apparatus of claim 1, wherein each of the first and second latching portions comprises a neck and a head formed on a top of the neck, a diameter of each head is greater than a diameter of each neck.

7. The circuit board mounting apparatus of claim 1, wherein when the circuit board is mounted to the second side plate in a parallel manner, tops of the first, second, and third mounting members abut an inner side of the second side plate.

8. A circuit board mounting apparatus, comprising: a chassis comprising a side plate defining a first slide hole, a second slide hole, and a through hole triangle arranged; a circuit board; a first mounting member mounted to a front side of the circuit board, wherein a first latching portion protrudes from a top of the first mounting member; a second mounting member mounted to the front side of the circuit board, wherein a latching hole is defined in a top of the second mounting member; a third mounting member mounted to a rear side of the circuit board, wherein a second latching portion protrudes from a top of the third mounting member; and a fastener; wherein the first and second latching portions of the first and third mounting members respectively extend through the first and second slide holes and slide to engage with portions of the side plate bounding the first and second slide holes, the fastener extends through the through hole and engages in the latching hole of the second mounting member, to mount the circuit board to the side plate in a parallel manner; and a first latching slot is defined in the front side of the circuit board, the circuit board forms two first sidewalls bounding opposite sides of the first latching slot, a first notch is defined in each first sidewall, two recesses are respectively defined in opposite sides of the first mounting member, extending horizontally through a front end and a rear end of the first mounting member, a resilient arm slantingly extends forward and outward from a sidewall of each recess, a hook protrudes from an outer side of each resilient arm, the first sidewalls are respectively engaged in the recesses of the first mounting member, and the hooks are respectively engaged in the first notches under resilient forces of the resilient arms.

9. The circuit board mounting apparatus of claim 8, wherein each of the first and second slide holes comprises a first hole and a second hole communicating with the first hole, a diameter of each first hole is greater than a diameter of each second hole, each of the first and second latching portions comprises a neck engaging with a portion of the side plate bounding the first or second slide hole, and a head formed on a top of the neck, to engage with an outer side of the side plate.

10. The circuit board mounting apparatus of claim 9, wherein a diameter of each head is greater than a diameter of each neck.

11. The circuit board mounting apparatus of claim 8, wherein tops of the first, second, and third mounting members abut an inner side of the side plate.

12. The circuit board mounting apparatus of claim 8, wherein the fastener is a screw, and the latching hole is a threaded hole.

13. The circuit board mounting apparatus of claim 8, wherein a first latching slot is defined in the front side of the circuit board, the circuit board forms two first sidewalls bounding opposite sides of the first latching slot, a first notch is defined in each first sidewall, two recesses are respectively defined in opposite sides of the second mounting member, extending horizontally through a front end and a rear end of the second mounting member, a resilient arm slantingly extends forward and outward from a sidewall of each recess, a hook protrudes from an outer side of each resilient arm, the first sidewalls are respectively engaged in the recesses of the second mounting member, and the hooks are respectively engaged in the first notches under resilient forces of the resilient arms.

14. The circuit board mounting apparatus of claim 8, wherein a second latching slot is defined in the rear side of the circuit board, the circuit board forms two second sidewalls bounding opposite sides of the second latching slot, a second notch is defined in each second sidewall, two recesses are respectively defined in opposite sides of the third mounting member, extending horizontally through a front end and a rear end of the third mounting member, a resilient arm slantingly extends rearward and outward from a sidewall of each recess, a hook protrudes from an outer side of each resilient arm, the second sidewalls are respectively engaged in the recesses of the third mounting member, and the hooks are respectively engaged in the second notches under resilient forces of the resilient arms.

15. The circuit board mounting apparatus of claim 8, wherein a fixing hole is defined in a front end of each of the first and second mounting members, to allow the circuit board to be perpendicularly mounted to a side plate of another chassis by two fasteners.

* * * * *